United States Patent
Fukuda et al.

(10) Patent No.: US 10,312,555 B2
(45) Date of Patent: Jun. 4, 2019

(54) DEFORMATION DETECTING SENSOR FOR SEALED SECONDARY BATTERY

(71) Applicant: TOYO TIRE & RUBBER CO., LTD., Osaka-shi, Osaka (JP)

(72) Inventors: Takeshi Fukuda, Osaka (JP); Junichi Shigeto, Osaka (JP)

(73) Assignee: TOYO TIRE CORPORATION, Itami-shi, Hyogo (JP)

( * ) Notice: Subject to any disclaimer, the term of this patent is extended or adjusted under 35 U.S.C. 154(b) by 305 days.

(21) Appl. No.: 15/123,817

(22) PCT Filed: Nov. 27, 2014

(86) PCT No.: PCT/JP2014/081458
§ 371 (c)(1),
(2) Date: Sep. 6, 2016

(87) PCT Pub. No.: WO2015/151331
PCT Pub. Date: Oct. 8, 2015

(65) Prior Publication Data
US 2017/0018820 A1    Jan. 19, 2017

(30) Foreign Application Priority Data
Mar. 31, 2014    (JP) .................. 2014-072396

(51) Int. Cl.
*H01M 10/48* (2006.01)
*H01F 10/08* (2006.01)
(Continued)

(52) U.S. Cl.
CPC ........ *H01M 10/482* (2013.01); *G01R 31/382* (2019.01); *H01F 10/08* (2013.01);
(Continued)

(58) Field of Classification Search
CPC .. H01M 10/482; H01M 2/1061; H01M 2/345; H01M 10/48; H01M 2220/30; G01R 31/3606; H01F 10/08
(Continued)

(56) References Cited

U.S. PATENT DOCUMENTS 4,576,726 A * 3/1986 Watanabe ............... C08G 18/58
                                                252/62.54
5,680,029 A * 10/1997 Smits .................... H01M 10/46
                                                320/107
(Continued)

FOREIGN PATENT DOCUMENTS

EP    0 093 545 A2    4/1983
JP    59-39 A         1/1984
(Continued)

OTHER PUBLICATIONS

Translation JP-2008234840-A (Year: 2008).*
(Continued)

*Primary Examiner* — Natalie Huls
*Assistant Examiner* — Monica S Young
(74) *Attorney, Agent, or Firm* — Westerman, Hattori, Daniels & Adrian, LLP

(57) ABSTRACT

A deformation detecting sensor for a sealed secondary battery of the present invention is used with a unit cell, battery module, or battery pack of the sealed secondary battery and includes: a magnetic resin layer stuck to the unit cell and/or battery module, the resin layer comprising a matrix composed of a resin component and a magnetic filler dispersed in the matrix; and a magnetic sensor attached to the inside or outside wall of a package case so as to be capable to detect a change of a magnetic field caused by the magnetic layer. The present invention can provide a deformation detecting sensor capable to detect bulging of a sealed (Continued)

secondary battery with higher sensitivity and to exhibit stable detection characteristics.

23 Claims, 1 Drawing Sheet

(51) Int. Cl.
  *H01M 2/10* (2006.01)
  *H01M 2/34* (2006.01)
  *G01R 31/382* (2019.01)
(52) U.S. Cl.
  CPC ......... *H01M 2/1061* (2013.01); *H01M 2/345* (2013.01); *H01M 10/48* (2013.01); *H01M 2220/30* (2013.01)
(58) Field of Classification Search
  USPC .......................................................... 73/779
  See application file for complete search history.

(56) References Cited

U.S. PATENT DOCUMENTS

| | | | | |
|---|---|---|---|---|
| 2006/0093896 | A1* | 5/2006 | Hong | H01M 2/34 429/61 |
| 2008/0036456 | A1* | 2/2008 | Kishida | G01R 33/04 324/244 |
| 2009/0218163 | A1 | 9/2009 | Takeuchi et al. | |
| 2010/0247980 | A1* | 9/2010 | Jang | H01M 2/34 429/10 |
| 2011/0285215 | A1* | 11/2011 | Hatase | H01F 27/2871 307/104 |
| 2012/0021619 | A1* | 1/2012 | Bilbrey | H01R 13/6205 439/39 |
| 2012/0196156 | A1* | 8/2012 | Suzuki | G11B 5/70 428/844 |
| 2012/0243120 | A1* | 9/2012 | Harasawa | G11B 5/70 360/90 |
| 2013/0089765 | A1 | 4/2013 | Murayama et al. | |
| 2013/0280569 | A1 | 10/2013 | Mori et al. | |
| 2014/0002269 | A1* | 1/2014 | Zhou | H01M 10/482 340/636.11 |
| 2015/0253207 | A1 | 9/2015 | Shigeto et al. | |

FOREIGN PATENT DOCUMENTS

| | | | |
|---|---|---|---|
| JP | 10-502767 | A | 3/1998 |
| JP | 2003-59484 | A | 2/2003 |
| JP | 2005-207841 | A | 8/2005 |
| JP | 2005-330300 | A | 12/2005 |
| JP | 2006-71733 | A | 3/2006 |
| JP | 2006-128062 | A | 5/2006 |
| JP | 2008-39659 | A | 2/2008 |
| JP | 2008-234840 | A | 10/2008 |
| JP | 2008234840 | A * | 10/2008 |
| JP | 2009-76265 | A | 4/2009 |
| JP | 2013-171697 | A | 9/2013 |
| WO | 2010/089921 | A1 | 8/2010 |
| WO | 2011/029575 | A1 | 3/2011 |
| WO | 2012/073770 | A1 | 6/2012 |
| WO | 2014/061684 | A1 | 4/2014 |

OTHER PUBLICATIONS

Extended (supplementary) European Search Report dated Sep. 8, 2017, issued in counterpart European Application No. 14888185.7. (8 pages).
Office Action dated Mar. 30, 2017, issued in counterpart Korean Application No. 10-2016-7026726, with English translation. (10 pages).
Office Action dated Mar. 30, 2018, issued in counterpart Chinese application No. 201480077667.X, with English translation. (11 pages).
International Search Report dated Jan. 13, 2015, issued in counterpart International Application No. PCT/JP2014/081458 (1 page).
International Search Report dated, Mar. 3, 2015, issued in counterpart International Application No. PCT/JP2014/081459 (2 pages).
Office Action dated Mar. 30, 2017, issued in counterpart Korean Application No. 10-2016-7026728, with English translation (14 pages).
Office Action dated Aug. 1, 2017, issued in counterpart Japanese Application No. 2016-511317, with English translation. (10 pages).
Office Action dated Nov. 7, 2017, issued in counterpart Japanese Application No. 2016-511317, with English translation. (6 pages).
Extended (supplementary) European Search Report dated Oct. 23, 2017, issued in counterpart European Application No. 14888163.4. (8 pages).
Office Action dated Mar. 30, 2018, issued in counterpart Chinese application No. 201480077538.0, with English translation. (17 pages).
Non-Final Office Action dated Oct. 5, 2018, issued in U.S. Appl. No. 15/126,899. (30 pages).

* cited by examiner

DEFORMATION DETECTING SENSOR FOR SEALED SECONDARY BATTERY

TECHNICAL FIELD

The present invention relates to a deformation detecting sensor for sealed secondary battery, a deformation detecting sensor system for sealed secondary battery, a unit cell comprising a deformation detecting sensor for sealed secondary battery, a battery module comprising a deformation detecting sensor for sealed secondary battery, a battery pack comprising a deformation detecting sensor for sealed secondary battery, a method for detecting bulging of a unit cell, a method for detecting bulging of a battery module, and a method for detecting bulging of a battery pack.

BACKGROUND ART

A sealed secondary battery has been widely used as power sources for portable devices such as mobile phones and notebook computers, in which a non-aqueous electrolyte secondary battery such as a lithium ion secondary battery or an aqueous electrolyte secondary battery such as a nickel-hydrogen secondary battery is sealed together with a protective circuit in a battery case such as a metal can or a laminate film. The protective circuit has a function for monitoring the voltage of the battery and blocking the charging current or discharging current when the overcharging or overdischarging occurs.

Since the non-aqueous electrolyte secondary battery uses a flammable organic electrolyte solution, the inside pressure of the battery may be raised by decomposition gas of the electrolyte solution and electrodes or vapor gas of the electrolyte solution generated by heat caused by overcharging or short circuit, and may cause the bulging of the battery, and may result in the explosion of the battery in the worst case. Moreover, in the case of aqueous electrolyte secondary battery, the battery may be expanded by the structural change of the electrode active material through charge and discharge and also by generated decomposition gas of the electrolyte solution and electrodes.

In contrast, a method for preventing rupture of the sealed secondary battery comprising detecting in advance the bulging of the sealed second battery and blocking the charging current or discharging current has been studied.

As a method of detecting the bulging of the sealed secondary battery, a method of using a PTC element is known (for example, Patent Document 1). The PTC element is electrically connected to the protective circuit, if a current exceeds the predetermined value and heat generation occurs in the sealed secondary battery, the element cuts off the current flowing between the sealed secondary battery and external devices by increasing the resistance value. However, as for the method of using the PTC element, there is a problem that the element cannot respond quickly to a rapid temperature rise of the sealed secondary battery. In contrast, methods for detecting bulging directly in place for detecting the heat generation caused by bulging have been proposed. According to this method, when the bulging occurs, it is possible to block current more quickly. For example, Patent Document 2 discloses a sealed secondary battery comprising a casing containing a positive electrode and a negative electrode and being capable of charging and discharging, and a safety element adhered to the surface of the casing and whose resistance value changes according to the bulging of the casing. It is described in Patent Document 2 that strain gauges are used as the safety element and those strain gauges are adhered to the surface of the casing using double-sided adhesive tape or double-sided adhesive film. Further, Patent Document 3 also discloses a battery in which strain gauges are adhered to the casing so as to detect the mechanical deformation of the battery.

CITATION LIST

Patent Literature

[Patent Document 1] Japanese Patent Publication No. 2009-76265
[Patent Document 2] Japanese Patent Publication No. 2006-125062
[Patent Document 3] Japanese Patent Publication No. 2003-59484

SUMMARY OF INVENTION

Technical Problem

However, while the methods of Patent Documents 2 and 3 have an advantage of detecting the bulging directly, there is a problem that, since those methods requires the strain gauges to be adhered to the casing via adhesive, double-sided adhesive tape or double-sided adhesive film, an adhesive layer such as adhesive, double-sided adhesive tape or double-sided adhesive film is present between the casing and the strain gauge, thus, in some cases sufficient detection characteristic cannot be obtained depending on the thickness of the adhesive layer or mechanical properties of the adhesive layer. Further, if the adhesion of the adhesive layer is insufficient, sometimes stable detection characteristic cannot be obtained.

Accordingly, an object of the present invention is to provide a deformation detecting sensor for sealed secondary battery which is capable of detecting bulging of the non-aqueous electrolyte secondary battery with higher sensitivity and providing a stable detection characteristics, a deformation detecting sensor system for sealed secondary battery, a unit cell comprising a deformation detecting sensor for sealed secondary battery, a battery module comprising a deformation detecting sensor for sealed secondary battery, a battery pack comprising a deformation detecting sensor for sealed secondary battery, a method for detecting bulging of a unit cell, a method for detecting bulging of a battery module, and a method for detecting bulging of a battery pack.

Solution to Problem

To solve the above problems, the present invention provides a deformation detecting sensor for sealed secondary battery used with a unit cell, a battery module and a battery pack of the sealed secondary battery, which is characterized by comprising a magnetic resin layer stuck to the unit cell and/or battery module, the resin layer comprising a matrix composed of a resin component and a magnetic filler dispersed in the matrix, and a magnetic sensor attached to the inside or outside wall of a package case so as to be capable to detect a change of a magnetic field caused by the magnetic layer.

Further, a deformation detecting sensor system for sealed secondary battery of the present invention is characterized by comprising the above deformation detecting sensor and a detection part for detecting a change of a magnetic field of a magnetic resin layer.

Further, a unit cell of the present invention is characterized by comprising a battery body housed in the package case, the battery body comprising a positive electrode, a negative electrode and a separator, wherein the unit cell comprises the above deformation detecting sensor for sealed secondary battery attached on the outside surface thereof.

Further, a battery module of the present invention is characterized by comprising a plurality of unit cells for sealed secondary battery electrically connected one another, each unit cell comprising a battery body housed in a package case, the battery body comprising a positive electrode, a negative electrode and a separator, wherein the battery module comprises the above deformation detecting sensor attached on the outside surface of at least one unit cell or on the inside or outside surface of the package case of the battery module.

Further, a battery pack of the present invention is characterized by comprising a plurality of battery modules which are electrically connected one another.

Further, a method for detecting a bulging of a unit cell of the present invention is characterized by comprising detecting a change of a magnetic field caused by a magnetic layer by using the above unit cell.

Further, a method for detecting a bulging of a battery module of the present invention is characterized by comprising detecting a change of a magnetic field caused by a magnetic layer by using the above battery module.

Further, a method for detecting a bulging of a battery pack of the present invention is characterized by comprising detecting a change of a magnetic field caused by a magnetic layer by using the above battery pack.

Advantageous Effects of Invention

According to the present invention, a deformation detecting sensor for sealed secondary battery which is capable to detect the bulging of the non-aqueous electrolyte secondary battery with high sensitivity and to obtain the stable detection characteristics can be provided.

BRIEF DESCRIPTION OF DRAWINGS

FIG. 1A is a perspective view, FIG. 1B is a transverse cross-sectional view.

DESCRIPTION OF EMBODIMENT

Figure 1A:
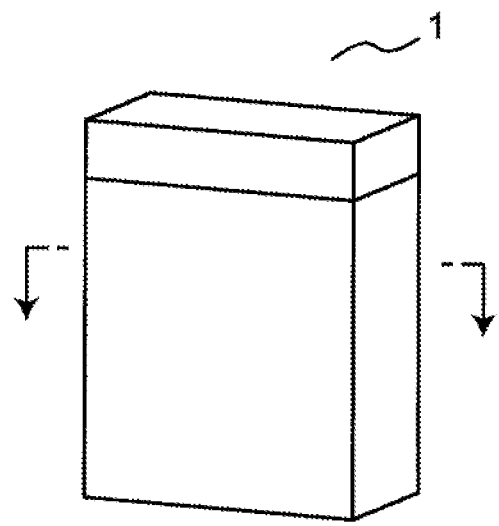
FIGS. 1A, 1B are schematic diagram showing an example of the shape of a battery module using a modification detection sensor enclosed secondary battery of the present invention.

Hereinafter, embodiments of the present invention will be described in detail.

The deformation detecting sensor for sealed secondary battery used for a unit cell, a battery module and a battery pack is characterized by comprising a magnetic resin layer stuck to the unit cell and/or battery module, the resin layer comprising a matrix composed of a resin component and a magnetic filler dispersed in the matrix, and a magnetic sensor attached to the an inside wall or an outside wall of a package case so as to be capable to detect a change of a magnetic field caused by the magnetic layer.

(Magnetic Resin Layer)

In the present invention, magnetic filler dispersed in the matrix composed of a resin component is used as a magnetic resin layer. The magnetic filler includes a rare earth based filler, an iron based filler, a cobalt based filler, a nickel based filler, and an oxide based filler or the like, among them, the rare earth based filler which is capable to provide a high magnetic force is preferred. The shape of the magnetic filler is not particularly limited and may be any among spherical, flat, needle, columnar and amorphous shapes. The average particle diameter of the magnetic filler is in the range of 0.02-500 μm, preferably 0.1-400 μm, more preferably 0.5-300 μm. When the average particle diameter is smaller than 0.02 μm, the magnetic properties of the magnetic filler deteriorates, and when the average particle size exceeds 500 μm, the mechanical property of the magnetic resin deteriorates and the magnetic resin becomes brittle. Further, the thickness of the magnetic resin layer is not particularly limited and may be 100-3000 μm, preferably 300-2000 μm, more preferably 500-1500 μm. When the thickness is less than 100 μm, the magnetic resin becomes brittle and the handleability is deteriorated when adding a predetermined amount of magnetic filler, and when the thickness is larger than 3000 μm, the degree of freedom in structural design of the sealed secondary battery is reduced.

Magnetic filler may be introduced into the resin component after magnetization. However, it is preferable to magnetize the magnetic filler after introducing the magnetic filler into the resin component. Since the magnetization after introducing the magnetic filler into the resin component can easily align the magnetic pole direction, it becomes easy to detect the magnetic force. In order to improve the affinity of the magnetic filler and a resin component, the magnetic filler may be subjected to a coupling treatment.

As a resin component, a thermoplastic resin, a thermosetting resin, or mixtures thereof may be used. Examples of the thermoplastic resins include such as styrene-based thermoplastic elastomer, polyolefin thermoplastic elastomer, polyurethane-based thermoplastic elastomers, polyester thermoplastic elastomers, polyamide thermoplastic elastomers, polybutadiene-based thermoplastic elastomers, polyisoprene-based thermoplastic elastomer, fluorine-based thermoplastic elastomer, ethylene-ethyl acrylate copolymers, ethylene-vinyl acetate copolymer, polyvinyl chloride, polyvinylidene chloride, chlorinated polyethylene, fluorine resins, polyamide, polyethylene, polypropylene, polyethylene terephthalate, polybutylene terephthalate, polystyrene, polybutadiene and the like. Examples of the thermosetting resins include diene synthetic rubbers such as polyisoprene rubber, polybutadiene rubber, styrene-butadiene rubber, polychloroprene rubber, acrylonitrile-butadiene rubber; non-diene-based rubber such as ethylene-propylene rubber, ethylene-propylene-diene rubber, butyl rubber, acrylic rubber, polyurethane rubber, fluorine rubber, silicone rubber, epichlorohydrin rubber; natural rubber, polyurethane resins, silicone resins, and epoxy resins. A thermosetting resin is preferable because the thermosetting resin can suppress the sag of the resin due to heat generation or overload of the battery. More preferably, the resin component is a polyurethane resin (polyurethane elastomer, urethane rubber) and silicone resin (silicone elastomer, silicone rubber). In order to adjust to the desired elastic modulus, a plasticizer may be added to the resin shown above, and the resin may be a foam body.

Polyurethane elastomers are obtained by reacting a polyol with a polyisocyanate. When using the polyurethane elastomer as the elastomer component, the active hydrogen-containing compound, a solvent and the magnetic filler are mixed and then the isocyanate component is mixed to obtain a mixed solution. Further, the solvent and the filler are mixed with the isocyanate component and then the active hydrogen-containing compound is mixed to obtain also a mixed solution. The magnetic elastomer can be produced by casting the mixed solution within a mold subjected to releasing treatment and subsequently heating the mixed solution to its curing temperature to cure the mixed solution. When using a silicone elastomer as the elastomer component, the magnetic elastomer can be produced by mixing solvent and magnetic filler with a precursor of a silicone elastomer to obtain a mixture, and placing the mixture in the mold and subsequently heating and curing the mixture. When necessary, the solvent may not be added.

As an isocyanate component which can be used in the polyurethane elastomer, compounds known in the field of polyurethane can be used. Examples of isocyanate components include aromatic diisocyanates such as 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate, m-xylylene diisocyanates; aliphatic diisocyanates such as ethylene diisocyanate, 2,2,4-trimethylhexamethylene diisocyanate, 1,6-hexamethylene diisocyanate; alicyclic diisocyanates such as 1,4-cyclohexane diisocyanate, 4,4'-dicyclohexyl methane diisocyanate, isophorone diisocyanate, and norbornane diisocyanate. These isocyanate components may be used alone or in combination of two or more thereof. Further, the isocyanate component may be a urethane-modified, allophanate-modified, biuret-modified or isocyanurate-modified isocyanate. Preferable isocyanate component is 2,4-toluene diisocyanate, 2,6-toluene diisocyanate, 4,4'-diphenylmethane diisocyanate, and more preferable isocyanate component is 2,4-toluene diisocyanate, 2,6-toluene diisocyanate.

As the active hydrogen-containing compound, active hydrogen-containing compound conventionally used in the field of polyurethane can be used. Examples of the active hydrogen-containing compounds include high molecular weight polyols: polyether polyols represented by polytetramethylene glycol, polypropylene glycol, polyethylene glycol, copolymers of propylene oxide, ethylene oxide and the like; polyester polyols represented by polybutylene adipate, polyethylene adipate, polyol consisting of 3-methyl-1,5-pentanediol and adipic acid and the like; polyester polycarbonate polyols represented by a reaction mixture of polyester glycols such as polyester polycarbonate polyol or polycaprolactone with an alkylene carbonate; polyester polycarbonate polyols obtained by reacting ethylene carbonate with a polyhydric alcohol to form a reaction mixture, and then reacting the reaction mixture with an organic dicarboxylic acid; and polycarbonate polyols obtained by a transesterification reaction of a polyhydroxyl compound and aryl carbonate. These may be used alone or in combination of two or more thereof.

In addition to the high molecular weight polyol components described above as the active hydrogen-containing compound, a low molecular weight polyol component and low molecular weight polyamine component may be used. Examples of the low molecular weight polyol components include ethylene glycol, 1,2-propylene glycol, 1,3-propylene glycol, 1,4-butanediol, 1,6-hexanediol, neopentyl glycol, 1,4-cyclohexanedimethanol, 3-methyl-1,5-pentanedial, diethylene glycol, triethylene glycol, 1,4-bis(2-hydroxyethoxy) benzene, trimethylolpropane, glycerin, 1,2,6 hexane triol, pentaerythritol, tetra methylol cyclohexane, methyl glucoside, sorbitol, mannitol, dulcitol, sucrose, 2,2,6,6-tetrakis (hydroxymethyl) cyclohexanol, and triethanolamine. Examples of the low molecular weight polyamine component include ethylenediamine, tolylenediamine, diphenylmethane diamine, diethylenetriamine. These may be used alone or in combination of two or more thereof. Further, it may be possible to mix polyamines. Examples of the polyamines include 4,4'-methylenebis (o-chloroaniline) (MOCA), 2,6-dichloro-p-phenylenediamine, 4,4'-methylenebis (2,3-dichloroaniline), 3,5-bis(methylthio)-2,4-toluene diamine, 3,5-bis(methylthio)-2,6-toluene diamine, 3,5-diethyl toluene-2,4-diamine, 3,5-diethyl toluene-2,6-diamine, trimethylene glycol-di-p-aminobenzoate, polytetramethylene oxide-di-p-aminobenzoate, 1,2-bis(2-aminophenylthio) ethane, 4,4'-diamino-3,3'-diethyl-5,5-dimethyl-diphenylmethane, N,N'-di-sec-butyl-4,4'-diaminodiphenylmethane, 4,4'-diamino-3,3'-diethyl diphenylmethane, 4,4'-diamino-3,3'-diethyl-5,5'-dimethyl-diphenylmethane, 4,4'-diamino-3,3'-diisopropyl-5,5'-dimethyl-diphenylmethane, 4,4'-diamino-3,3',5,5'-tetraethyl-diphenylmethane, 4,4'-diamino-3,3',5,5'-tetraisopropyl diphenyl methane, m-xylylene diamine, N,N'-di-sec-butyl-p-phenylene diamine, m-phenylene diamine, and p-xylylene diamine. Preferred active hydrogen-containing compounds include polytetramethylene glycol, polypropylene glycol, copolymers of propylene oxide and ethylene oxide, a polyester polyol consisting of 3-methyl-1,5-pentanediol and adipic acid, more preferably polypropylene glycol, copolymers of propylene oxide and ethylene oxide.

As for the preferred combinations of the isocyanate components and active hydrogen-containing compounds, examples include combinations of one or more of the isocyanate components selected from the group consisting of 2,4-toluene diisocyanate, 2,6-toluene diisocyanate, and 4,4'-diphenylmethane diisocyanate, and one or more of the active hydrogen-containing compounds selected from the group consisting of polytetramethylene glycol, polypropylene glycol, copolymers of propylene oxide and ethylene oxide, and a polyester polyol consisting of 3-methyl-1,5-one-pentanediol and adipic acid. More preferable combinations include 2,4-toluene diisocyanate and/or 2,6-toluene diisocyanate as the isocyanate component, and polypropylene glycol and/or copolymers of propylene oxide and ethylene oxide as the active hydrogen-containing compound.

When using the polyurethane elastomer, the residual hydroxyl group concentration is within the range of 0.2-0.9 meq/g, preferably 0.2-0.85 meq/g. When the residual hydroxyl group concentration is less than 0.2 meq/g, adhesive strength to the unit cell or the battery module degrades, while when the residual hydroxyl group concentration is more than 0.9 meq/g, the curing of the magnetic resin becomes insufficient.

In addition, after sticking the magnetic resin to the unit cell or the battery module, the magnetic resin may be heated in a temperature range of 60-130° C., preferably 70-120° C., more preferably 80-110° C., and in a time range of 10-60 minutes. This is because the adhesive strength to the unit cell or the battery module can be improved.

The amount of the magnetic filler in the magnetic resin is 1-450 parts by weight, preferably 2-400 parts by weight relative to 100 parts by weight of the resin component. When the amount is less than 1 part by weight, it becomes difficult to detect a change of a magnetic field, when it exceeds 450 parts by weight, the magnetic resin itself becomes brittle.

In the present invention, the magnetic filler may be unevenly distributed in the resin component at a specific uneven distribution degree. The "uneven distribution degree" as used herein is a number value representing a degree that the magnetic filler is unevenly distributed in the resin component, and it is measured by the following methods. A sample is cut from the prepared magnetic resin with a razor blade, a cross-section of the sample is observed using a digital microscope at a magnification of 100. Using an image analysis software ("WinROOF" from Mitani Corporation), the obtained image is divided into three equal parts in the thickness direction, that is, an upper layer, a middle layer and a lower layer, and the number of particles of magnetic filler in each layer is counted. An abundance ratio of the magnetic filler in each layer is determined by calculating a ratio of the number of particles of each layer to that of the middle layer. In addition, the uneven distribution degree is determined by calculating a value of [(the abundance ratio of the magnetic filler in the upper layer)−(the abundance ratio of the magnetic filler in the lower layer)]. The higher the value of uneven distribution degree, the magnetic filler is more unevenly distributed. In the present invention, it is preferable that the magnetic filler is unevenly distributed in the thickness direction of the magnetic resin layer and that the magnetic filler concentration on the side of the magnetic sensor is higher than that on the side of the unit cell or the battery module. Since the amount of the magnetic filler on the side of the unit cell or the battery module becomes low when unevenly distributing the magnetic filler to the magnetic sensor side, it becomes possible to further increase the interaction between the unit cell or the battery module and the resin component as compared to cases where the magnetic filler is no unevenly distributed. Thus, it becomes possible to improve the adhesive strength of the magnetic resin to the unit cell or the battery module, and thereby further stabilizing the detection characteristics.

The uneven distribution degree of the magnetic filler is in the range of 1-90, preferably 2-90, more preferably 3-80.

The adhesive strength of the magnetic resin to the unit cell or the battery module can be further increased by making the uneven distribution degree to be more than or equal to 1. For example, when using polyurethane elastomers as the resin component, if the uneven distribution degree is less than 1, since the residual hydroxyl group concentration of the resin component of the unit cell or the battery module side is low, enough adhesive strength to the unit cell or the battery module may not be obtained. Further, when the uneven distribution degree is more than 90, the magnetic resin becomes brittle and handling becomes difficult.

In order to unevenly distributing the magnetic filler, a method can be used, in which, after introducing the magnetic filler in the resin component, the magnetic filler is subjected to stand at room temperature or a predetermined temperature and to be set naturally by its own weight. The uneven distribution degree can be adjusted by changing the time and/or temperature for standing. Further, the magnetic filler may be unevenly distributed by using a physical force such as a centrifugal force or magnetic force.

Further, the magnetic resin layers may be formed in multi-layer structure composed of a plurality of single layers. For example, a plurality of single layers each having a different concentration of magnetic filler may be laminated so that the magnetic filler is unevenly distributed to the unit cell side or battery module side.

Further, when arranging the magnetic resin layer outside of the unit cell, it may be possible to arrange one single layer containing magnetic filler to the magnetic sensor side and laminate another single layer containing no magnetic filler on the one single layer. In that case, the magnetic filler may be or may not be unevenly distributed in the one single layer.

The deformation detecting sensor system for sealed secondary battery of the present invention comprises a deformation sensor of the present invention and a detection part for detecting a change of magnetic field of the magnetic resin layer. A magnetic sensor may be used in the detection part. The magnetic sensor may be generally a sensor used to detect the change of magnetic field. Examples of the magnetic sensors include a magnetoresistive element (e.g., semiconductor compound magnetoresistive element, an anisotropic magnetoresistance element (AMR), giant magnetoresistance element (GMR) or tunnel magnetoresistive element (TMR)), Hall element, an inductor, MI elements, fluxgate sensor and the like. From the viewpoint of having a wide sensitivity region, the Hall element is preferred. The magnetic sensor may be arranged near the magnetic resin layer, preferably so as to face the magnetic resin layer.

The sealed secondary battery using a deformation detection sensor of the present invention is obtained by hermetically housing a battery body comprising a positive electrode, a negative electrode and a separator, for example, the battery body being produced by laminating or winding a positive electrode and a negative electrode via a separator, in a package case. Examples thereof include a non-aqueous electrolyte secondary battery such as a lithium ion secondary battery, alkaline secondary battery such as a nickel-cadmium secondary battery and a nickel-hydrogen secondary battery. Further, the deformation detecting sensor of the present invention may be used in a unit cell, battery module or battery pack of the sealed secondary batteries. Here, the unit cell is a cell comprising a positive electrode, a negative electrode and a separator and being sealed in a package case. Further, the battery module is obtained by electrically connecting a plurality of the unit cells. Further, the battery pack is obtained by electrically connecting a plurality of the battery modules.

The portion to be measured to which the deformation detection sensor of the present invention is stuck is an easily deformable portion of the sealed secondary battery. Examples of the portion to be measured include an outside surface of a package case of the unit cell, inside and outside surfaces of a package case of the battery module, and inside and outside surfaces of a package case of battery pack. The area of the portion to be measured is not particularly limited and may be appropriately selected depending on the size and sticking position of the package case.

When detecting bulging of a unit cell, a change of magnetic field of a magnetic resin layer constituting a deformation detection sensor of the present invention can be measured by using a detection part and by employing the unit cell having the deformation detection sensor of the present invention on the outside surface of its package case. Further, when detecting bulging of a battery module, a change of magnetic field of a magnetic resin layer constituting a deformation detection sensor of the present invention can be measured by using the detection part and by employing the unit cell having the deformation detection sensor of the present invention on the outside surface of its package case or by using a package case having the deformation detection sensor of the present invention on the inside or outside surface of its package case as a package case for the battery module. Further, when detecting the bulging of a battery pack, a change of magnetic field of a magnetic resin layer constituting the deformation detection sensor of the present invention can be measured by using the detection part and by employing the unit cell having the deformation detection sensor of the present invention on the outside surface of its package case or by using a battery module housed in a package case having the deformation detection sensor of the present invention on the inside or outside surface of its package case or by using a package case for the battery pack having the deformation detection sensor of the present invention on the inside surface of its package case as a package case for the battery module.

Figure 1B:
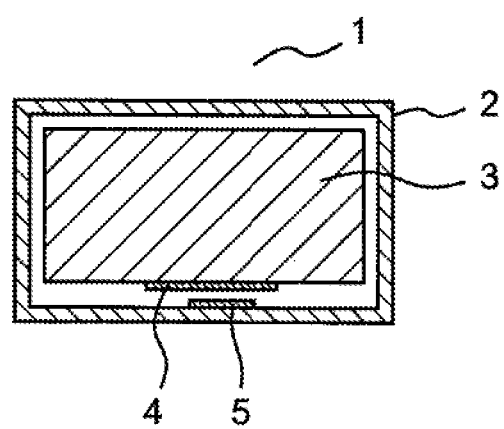

FIGS. 1A, 1B are schematic view showing an example of a structure of the battery module, and FIG. 1A is a perspective view of the battery module using the rectangular can-shaped package case, and FIG. 1B is a transverse cross-sectional view of the battery module. The battery module 1 comprises a unit cell 3 which is housed in a package case 2. A magnetic resin layer 4 is stuck on the surface of the package case of the unit cell 3, and a magnetic sensor 5 is arranged on the inside surface of the package case 2 so as to approximately face the magnetic resin layer 4. The bulging of the unit cell 3 is detected by the magnetic sensor 5. When the bulging which is not lower than a preset value is detected by the magnetic sensor 5, a protection circuit (not shown) which is electrically connected with the magnetic sensor 5 cuts off the current between an external device and the unit cell 3. In FIGS. 1A, 1B, although there is shown an example in which one magnetic sensor is arranged in the unit cell, a plurality of magnetic sensors may be arranged in the unit cell according to the shape and size of the battery body. Further, in FIGS. 1A, 1B, although there is shown an example in which the magnetic sensor is arranged on the inside surface of the package case, it can be obtained the same effect when the magnetic sensor is arranged on the outside surface of the package case.

EXAMPLES

The present invention is further described below while referring to Examples, but it must be noted that the present invention is not limited by these examples alone.

The following ingredients were employed for the preparation of the magnetic resin (resin component: polyurethane elastomer).

TDI-100: toluene diisocyanate (2,4-body=100%) (manufactured by Mitsui Chemicals, Inc.)
Polyol A: a polyoxypropylene glycol obtained by adding propylene oxide to glycerin initiator, OHV56, functional group number of 3 (manufactured by Asahi Glass Co., Ltd.).
Polyol B: a polyoxypropylene glycol obtained by adding propylene oxide to propylene glycol initiator, OHV56, functional group number of 2 (manufactured by Asahi Glass Co., Ltd.).
Polyol C: a polyoxypropylene glycol obtained by adding propylene oxide to pentaerythritol initiator, OHV75, functional group number of 4 (manufactured by Toyo Tire & Rubber Co., Ltd.).
Polyol D: a polyester polyol as starting ingredients of 3-methyl-1,5-pentanediol and trimethylolpropane and adipic acid, OHV56, functional group number of 3 (manufactured by Kuraray Co., Ltd.).
Neodymium-based filler: MF-15P (average particle diameter of 133 μm) (manufactured by Aichi Steel Co., Ltd.)
Samarium-based filler: SmFeN alloy powder (average particle diameter of 2.6 μm) (manufactured by Sumitomo Metal Mining Co., Ltd.)

Further, as a prepolymer, two kinds of prepolymer (A, B) shown in Table 1 were used,

TABLE 1

| | | Prepolymer A | Prepolymer B |
|---|---|---|---|
| TDI-100 | NCO % = 48.3% | 14.8 (parts by weight) | 18.8 (parts by weight) |
| Polyol A | OHV = 56 | 85.2 | — |

TABLE 1-continued

| | | Prepolymer A | Prepolymer B |
|---|---|---|---|
| | | (parts by weight) | |
| Polyol B | OHV = 75 | — | 81.2 (parts by weight) |
| | NCO % | 3.58 (%) | 4.55 (%) |

Example 1

In the reaction vessel, 85.2 parts by weight of polypropylene glycol as polyether polyol (manufactured by Asahi Glass Company, EXCENOL 3030, number average molecular weight 3000, functional group number of 3) was put and dehydrated under reduced pressure for 1 hour while stirring. After that, the reaction vessel was purged with nitrogen gas. To the reaction vessel, 14.8 parts by weight of 2,4-toluene diisocyanate (manufactured by Mitsui Chemicals, Inc., Cosmonate T-100) was added, and then was reacted for 3 hours while the temperature in the reaction vessel was maintained at 80° C. to synthesize an isocyanate-terminated prepolymer A.

Next, to a mixed solution containing 213.0 parts by weight of polypropylene glycol (manufactured by Asahi Glass Company, EXCENOL 3030, number average molecular weight 3000, functional group number of 3) and 0.39 parts by weight of lead octylate (Toei Kako Co., BTT-24), 631.16 parts by weight of neodymium-based filler (Aichi Steel Corp., MF-15P) was added to prepare a filler dispersion. This dispersion was defoamed under reduced pressure, and to this dispersion, 213.0 parts by weight of the above prepolymer A which was similarly defoamed under reduced pressure was added, and then subjected to mixing and defoaming by revolution-rotation mixer (Thinky Co., Ltd.). This dispersion was cast on the PET film having a 1.0 mm spacer and subjected to a release treatment, and a thickness of the cast dispersion was adjusted to 1 mm with a nip roll. Then, the cast dispersion was allowed to stand at room temperature for 30 minutes as the uneven distribution treatment, and thereby settling the magnetic filler. Then, the cast dispersion was cured at 80° C. for 1 hour to obtain an filler dispersed polyurethane elastomer. A magnetic resin was obtained by magnetizing the resulting elastomer with a magnetization device (manufactured by Denshijiki Industry Co., Ltd.). Formulation and manufacturing conditions are shown in Table 2.

The magnetic resins of Examples 2 to 11 and Comparative Example 1 were prepared according to the formulation and the manufacturing conditions shown in Table 2.

The prepared magnetic resins were subjected to uneven distribution degree evaluation, adhesive property evaluation, sensor characteristics stability evaluation and surface texture evaluation. In the sensor characteristics stability evaluation, a Hall element is used as the magnetic sensor.

(Uneven Distribution Degree Evaluation)

A sample was cut from the prepared magnetic resin with a razor blade, a cross-section of the sample was observed using a digital microscope at a magnification of 100. Using an image analysis software ("WinROOF" from Mitani Corporation), the obtained image was divided into three equal parts in the thickness direction, that is, an upper layer, middle layer and lower layer, and the number of particles of magnetic filler in each layer was counted. An abundance ratio of the magnetic filler in each layer was determined by calculating a ratio of the number of particles of each layer to that of the middle layer. Further, the uneven distribution degree was determined by calculating a value of [(the abundance ratio of the magnetic filler in the upper layer)–(the abundance ratio of the magnetic filler in the lower layer). The results are shown in Table 2.

(Adhesive Property Evaluation)

The shear strength was measured based on ASTM D1002-94. The measurements were made using a Shimadzu autograph at a speed of 20 mm/min. An aluminum plate was used as a metal piece, and the prepared magnetic resin was stuck to the aluminum plate by direct sticking. The stucked portion was 25 mm square in size. A test piece was subjected to be cured for 48 hours under the condition of 23° C.×50%. The results are shown in Table 2.

(Sensor Characteristics Stability Evaluation)

The magnetic resin of 30 mm square in size was directly stuck to the aluminum plate such that the filler concentration of the battery body side becomes low. This test piece was installed in the vibration testing machine, and was subjected to a vibration test of adding a sine wave of amplitude 0.8 mm (total amplitude 1.6 mm) and a frequency 200 Hz. The sine wave was added from three directions orthogonal to each other for three hours for each direction. A rate of change of the sensor characteristics value after the vibration test to its initial value (%) (hereinafter, referred to as "characteristic change rate") was set as index for characteristics stability. A smaller value of the characteristic change rate shows more excellent characteristic stability. The sensor characteristics were obtained from the output voltage change rate of the Hall element (Asahi Kasei Electronics Co., Ltd. EQ-430L) when applying a pressure of 1 kPa. The number of measurements was 5 times. The results are shown in Table 2.

(Surface Texture Evaluation)

The surface texture of the prepared magnetic resin was evaluated based on the following criteria.

◯: Surface is even (good handling property)
x: Surface is uneven (bad handling property)

TABLE 2

| | | | Example 1 | Example 2 | Example 3 | Example 4 | Example 5 | Example 6 | Example 7 |
|---|---|---|---|---|---|---|---|---|---|
| Formulation | Prepolymer | Prepolymer A | 100 | 100 | 100 | 100 | 100 | | 100 |
| | | Prepolymer B | | | | | | 100 | |
| | Curing agent | Polyol A | 213 | 213 | 213 | 213 | 71 | | |
| | | Polyol B | | | | | 71 | | |
| | | Polyol C | | | | | | 406.3 | |
| | | Polyol D | | | | | | | 213 |
| | Filler | Neodymium-based | 631.16 | | 631.16 | 631.16 | 564.66 | 1181.36 | 631.16 |
| | | Samarium-based | | 631.16 | | | | | |
| | Solvent | Toluene | | | | | | | |
| | Catalyst | Lead octylate | 0.39 | 0.39 | 0.39 | 0.39 | 0.3 | 0.63 | 0.39 |
| | | NCO index | 0.4 | 0.4 | 0.4 | 0.4 | 0.6 | 0.2 | 0.4 |
| | | Residual OH conc. (meq/g) | 0.41 | 0.41 | 0.41 | 0.41 | 0.24 | 0.83 | 0.41 |
| Manufacturing Condition | | Application method | direct | direct | direct | direct | direct | direct | direct |
| | | Time of uneven distribution treatment (min) | 30 | 30 | 3 | 60 | 30 | 30 | 0 |
| Result | | Uneven distribution degree | 60.7 | 57.6 | 4.7 | 83.1 | 64.2 | 54.1 | 1.2 |
| | | Adhesive property (N/25 mm □) | 40.1 | 47.2 | 35.3 | 50.9 | 48.3 | 52.1 | 30.9 |
| | | Characteristic change rate (%) | 12.6 | 13.2 | 15.2 | 10.2 | 11.4 | 10.8 | 17.2 |
| | | Surface texture | ◯ | ◯ | ◯ | ◯ | ◯ | ◯ | ◯ |

| | | | Example 8 | Example 9 | Example 10 | Example 11 | Comparative Example 1 |
|---|---|---|---|---|---|---|---|
| Formulation | Prepolymer | Prepolymer A | 100 | 100 | 100 | | 100 |
| | | Prepolymer B | | | | 100 | |
| | Curing agent | Polyol A | | 213 | | | 213 |
| | | Polyol B | | | 106.5 | | |
| | | Polyol C | | | | 541.5 | |
| | | Polyol D | 213 | | | | |
| | Filler | Neodymium-based | 631.16 | 631.16 | 481.83 | 1496.6 | 631.16 |
| | | Samarium-based | | | | | |
| | Solvent | Toluene | | 200 | | | |
| | Catalyst | Lead octylate | 3.91 | 0.39 | 0.26 | 8.02 | 0.39 |
| | | NCO index | 0.4 | 0.4 | 0.8 | 0.15 | 0.4 |
| | | Residual OH conc. (meq/g) | 0.41 | 0.41 | 0.1 | 0.93 | 0.41 |
| Manufacturing Condition | | Application method | direct | direct | direct | direct | double-sided tape |
| | | Time of uneven distribution treatment (min) | 0 | 0 | 30 | 30 | 30 |
| Result | | Uneven distribution degree | 0.7 | 92.4 | 59.5 | 45.6 | 60.7 |
| | | Adhesive property (N/25 mm □) | 30.1 | 36.9 | 33.7 | 31.4 | 23.9 |
| | | Characteristic change rate (%) | 18.7 | 16.4 | 17.9 | 18.4 | 24.7 |
| | | Surface texture | ◯ | X | ◯ | ◯ | ◯ |

(Results)

The magnetic resins of Examples 1-11 have excellent adhesive property, sensor characteristics stability and surface texture. On the other hand, in Comparative Example 1 in which the magnetic resin was stuck to the aluminum plate using a double-sided tape, a peeling of the magnetic resin occurred when evaluating the sensor characteristics stability and thus the characteristic stability was poor.

INDUSTRIAL APPLICABILITY

According to the present invention, since the bulging of the non-aqueous electrolyte secondary battery can be detected with high sensitivity and the stable detection characteristic can be obtained, it can be possible to further improve the safety of the nonaqueous electrolyte secondary battery.

DESCRIPTION OF REFERENCE NUMERALS

1 Battery module
2 Package case
3 Unit cell
4 Magnetic resin layer
5 Magnetic sensor

The invention claimed is:

1. A deformation detecting sensor for a sealed secondary battery used with a unit cell, battery module and battery pack of the sealed secondary battery, comprising:
   a magnetic resin layer; and
   a magnetic sensor;
   wherein the magnetic resin layer is stuck to the unit cell, the battery module or both;
   wherein the magnetic resin layer comprises a matrix composed of a resin component and a magnetic filler that is dispersed in the matrix;
   wherein the magnetic sensor is attached to an inside wall or an outside wall of a package case;
   wherein the magnetic sensor is capable of detecting a change in magnetic field that is caused by the magnetic resin layer, and
   wherein the magnetic filler is unevenly distributed in the thickness direction of the magnetic resin layer and the concentration of the magnetic filler is made higher on the magnetic sensor side than on the unit cell side.

2. The deformation detecting sensor for the sealed secondary battery according to claim 1, wherein the resin component is a polyurethane resin or a silicone resin.

3. The deformation detecting sensor for the sealed secondary battery according to claim 2, wherein the resin has a residual hydroxyl group concentration of 0.2-0.9 meq/g.

4. A deformation detecting sensor system for sealed secondary battery comprising:
   the deformation detecting sensor according to claim 3; and
   a detection part for detecting a change of a magnetic field caused by a magnetic resin layer.

5. A battery module comprising a plurality of unit cells for sealed secondary battery electrically connected one another, each unit cell comprising a battery body housed in a package case, the battery body comprising a positive electrode, a negative electrode and a separator, wherein the battery module comprises the deformation detecting sensor according to claim 3 attached on the outside surface of at least one unit cell or on the inside or outside surface of the package case of the battery module.

6. The battery module comprises the deformation detecting sensor according to claim 3 attached on the inside or outside surface of the package case of the battery module.

7. The unit cell comprises the deformation detecting sensor according to claim 3 attached on an outer surface of the unit cell.

8. A deformation detecting sensor system for sealed secondary battery comprising:
   the deformation detecting sensor according to claim 2; and
   a detection part for detecting a change of a magnetic field caused by a magnetic resin layer.

9. A battery module comprising a plurality of unit cells for sealed secondary battery electrically connected one another, each unit cell comprising a battery body housed in a package case, the battery body comprising a positive electrode, a negative electrode and a separator, wherein the battery module comprises the deformation detecting sensor according to claim 2 attached on the outside surface of at least one unit cell or on the inside or outside surface of the package case of the battery module.

10. The battery module comprises the deformation detecting sensor according to claim 2 attached on the inside or outside surface of the package case of the battery module.

11. The unit cell comprises the deformation detecting sensor according to claim 2 attached on an outer surface of the unit cell.

12. The deformation detecting sensor for the sealed secondary battery according to claim 1, wherein a part to be measured is an outside surface of the unit cell.

13. A deformation detecting sensor system for sealed secondary battery comprising:
   the deformation detecting sensor according to claim 12; and
   a detection part for detecting a change of a magnetic field caused by a magnetic resin layer.

14. A battery module comprising a plurality of unit cells for sealed secondary battery electrically connected one another, each unit cell comprising a battery body housed in a package case, the battery body comprising a positive electrode, a negative electrode and a separator, wherein the battery module comprises the deformation detecting sensor according to claim 12 attached on the outside surface of at least one unit cell or on the inside or outside surface of the package case of the battery module.

15. The battery module comprises the deformation detecting sensor according to claim 12 attached on the inside or outside surface of the package case of the battery module.

16. The unit cell comprises the deformation detecting sensor according to claim 12 attached on an outer surface of the unit cell.

17. A deformation detecting sensor system for sealed secondary battery comprising:
   the deformation detecting sensor according to claim 1; and
   a detection part for detecting a change of a magnetic field caused by a magnetic resin layer.

18. A battery module comprising a plurality of unit cells for sealed secondary battery electrically connected one another, each unit cell comprising a battery body housed in a package case, the battery body comprising a positive electrode, a negative electrode and a separator, wherein the battery module comprises the deformation detecting sensor according to claim 1 attached on the outside surface of at least one unit cell or on the inside or outside surface of the package case of the battery module.

19. The deformation detecting sensor for the sealed secondary battery according to claim 1, wherein the magnetic filler is selected from the group consisting of a rare earth based filler, an iron based filler, a cobalt based filler, a nickel based filler, an oxide based filler or a combination thereof.

20. The deformation detecting sensor for the sealed secondary battery according to claim 1, wherein the magnetic resin layer has a thickness of 100 μm to 3000 μm.

21. The deformation detecting sensor for the sealed secondary battery according to claim 1, wherein the amount of the magnetic filler resin layer is 1 to 450 parts by weight relative to 100 parts by weight of the resin component.

22. The battery module comprises the deformation detecting sensor according to claim 1 attached on the inside or outside surface of the package case of the battery module.

23. The unit cell comprises the deformation detecting sensor according to claim 1 attached on an outer surface of the unit cell.

* * * * *